(12) United States Patent
Liao et al.

(10) Patent No.: US 12,199,000 B2
(45) Date of Patent: Jan. 14, 2025

(54) SEMICONDUCTOR DEVICE STRUCTURES AND METHODS OF MANUFACTURING THE SAME

(71) Applicant: INNOSCIENCE (ZHUHAI) TECHNOLOGY CO., LTD., Zhuhai (CN)

(72) Inventors: Hang Liao, Zhuhai (CN); Qingyuan He, Zhuhai (CN); Chunhua Zhou, Zhuhai (CN)

(73) Assignee: INNOSCIENCE (ZHUHAI) TECHNOLOGY CO., LTD., Zhuhai (CN)

( * ) Notice: Subject to any disclaimer, the term of this patent is extended or adjusted under 35 U.S.C. 154(b) by 0 days.

(21) Appl. No.: 18/623,010

(22) Filed: Mar. 31, 2024

(65) Prior Publication Data
US 2024/0243029 A1   Jul. 18, 2024

Related U.S. Application Data

(62) Division of application No. 17/252,287, filed as application No. PCT/CN2020/112161 on Aug. 28, 2020, now Pat. No. 11,972,996.

(51) Int. Cl.
*H01L 23/34* (2006.01)
*H01C 7/02* (2006.01)
(Continued)

(52) U.S. Cl.
CPC .............. *H01L 23/34* (2013.01); *H01C 7/02* (2013.01); *H01C 7/04* (2013.01); *H01C 17/00* (2013.01);
(Continued)

(58) Field of Classification Search
CPC .......... H01L 23/34; H01C 17/00; H01C 7/008
See application file for complete search history.

(56) References Cited

U.S. PATENT DOCUMENTS

2006/0289901 A1* 12/2006 Sheppard ............... H10N 39/00
257/256
2012/0132912 A1* 5/2012 Suekawa ............. H01L 29/7804
257/49
(Continued)

FOREIGN PATENT DOCUMENTS

CN        104934389        9/2015
CN        111123064        5/2020

OTHER PUBLICATIONS

ISA State Intellectual Property Office of the People's Republic of China, International Search Report Issued in Application No. PCT/CN2020/112161, Apr. 29, 2021, WIPO, 3 pages.
(Continued)

*Primary Examiner* — Errol V Fernandes
(74) *Attorney, Agent, or Firm* — JCIPRNET

(57) ABSTRACT

The semiconductor device structure includes a substrate, a first nitride semiconductor layer, a second nitride semiconductor layer, a first electrode, a second electrode, a gate structure and a temperature sensitive component. The first nitride semiconductor layer is disposed on the substrate. The second nitride semiconductor layer is disposed on the first nitride semiconductor layer and has a bandgap greater than that of the first nitride semiconductor layer. The first electrode is disposed on the second nitride semiconductor layer. The second electrode is disposed on the second nitride semiconductor layer. The gate structure is disposed on the second nitride semiconductor layer and between the first electrode and the second electrode. The temperature sensitive component is disposed external to a region between the gate structure and the first electrode along a first direction in
(Continued)

parallel to an interface of the first nitride semiconductor layer and the second nitride semiconductor layer.

14 Claims, 11 Drawing Sheets

(51) Int. Cl.
*H01C 7/04* (2006.01)
*H01C 17/00* (2006.01)
*H01L 29/20* (2006.01)
*H01L 29/205* (2006.01)
*H01L 29/66* (2006.01)
*H01L 29/778* (2006.01)

(52) U.S. Cl.
CPC ........ *H01L 29/2003* (2013.01); *H01L 29/205* (2013.01); *H01L 29/66462* (2013.01); *H01L 29/7786* (2013.01)

(56) References Cited

U.S. PATENT DOCUMENTS

| | | |
|---|---|---|
| 2012/0187452 A1* | 7/2012 | Saito ................. H01L 29/66462 257/E29.091 |
| 2015/0270254 A1 | 9/2015 | Risbud |
| 2016/0343702 A1 | 11/2016 | Tomita et al. |
| 2019/0028065 A1 | 1/2019 | Mahon et al. |
| 2019/0305175 A1* | 10/2019 | Udrea ................. H01L 27/1446 |

OTHER PUBLICATIONS

ISA State Intellectual Property Office of the People's Republic of China, Written Opinion of the International Searching Authority Issued in Application No. PCT/CN2020/112161, Apr. 29, 2021, WIPO, 3 pages.

State Intellectual Property Office of the People's Republic of China, Office Action and Search Report Issued in Application No. 2020800028053, Jul. 30, 2021, 14 pages. (Submitted with Machine/Partial Translation).

"State Intellectual Property Office of the People's Republic of China, Notification to Grant patent Right forinvention Issued in Application No. 2020800028053, Apr. 20, 2022, 8 pages. (Submitted with Machine/Partial Translation)".

* cited by examiner

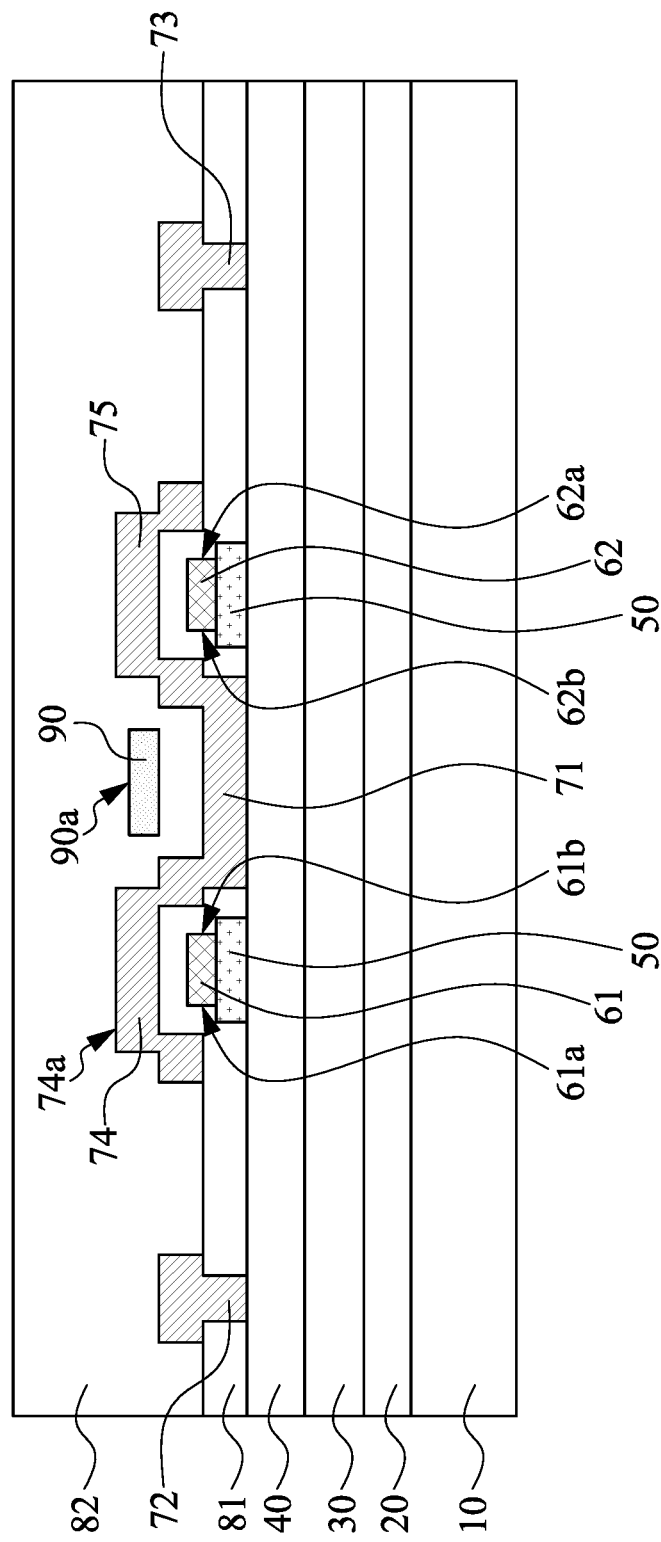

SEMICONDUCTOR DEVICE STRUCTURES AND METHODS OF MANUFACTURING THE SAME

CROSS-REFERENCE TO RELATED APPLICATIONS

This application is a divisional application of U.S. patent application Ser. No. 17/252,287, filed on Dec. 15, 2020, now pending, which is a 371 application of an international PCT application serial no. PCT/CN2020/112161, filed on Aug. 28, 2020. The entirety of each of the above-mentioned patent applications is hereby incorporated by reference herein and made a part of this specification.

BACKGROUND

Field of the Disclosure

The present disclosure relates to a semiconductor device structure and more particularly to a semiconductor device structure including a temperature sensitive component.

Description of Related Art

Components including direct bandgap semiconductors, such as, for example, semiconductor components including group III-V materials or group III-V compounds (Category: III-V compounds) can operate or work under a variety of conditions or in a variety of environments (e.g., at different voltages and frequencies).

The semiconductor components may include a heterojunction bipolar transistor (HBT), a heterojunction field effect transistor (HFET), a high-electron-mobility transistor (HEMT), a modulation-doped FET (MODFET) and the like.

SUMMARY

According to some embodiments of the present disclosure, a semiconductor device structure includes a substrate, a first nitride semiconductor layer, a second nitride semiconductor layer, a first electrode, a second electrode, a gate structure, a temperature sensitive component and a first metal layer. The first nitride semiconductor layer is disposed on the substrate. The second nitride semiconductor layer is disposed on the first nitride semiconductor layer and has a bandgap greater than that of the first nitride semiconductor layer. The first electrode is disposed on the second nitride semiconductor layer. The second electrode is disposed on the second nitride semiconductor layer. The gate structure is disposed on the second nitride semiconductor layer and between the first electrode and the second electrode. The temperature sensitive component is disposed external to a region between the gate structure and the first electrode along a first direction in parallel to an interface of the first nitride semiconductor layer and the second nitride semiconductor layer. The first metal layer is electrically connected to the second electrode. The temperature sensitive component is disposed between the second electrode and the first metal layer along a second direction substantial vertical to the interface of the first nitride semiconductor layer and the second nitride semiconductor layer.

According to some embodiments of the present disclosure, a semiconductor device structure includes a substrate, a first nitride semiconductor layer, a second nitride semiconductor layer, a first gate structure, a second gate structure, a first electrode and a thermistor. The first nitride semiconductor layer is disposed on the substrate. The second nitride semiconductor layer is disposed on the first nitride semiconductor layer and has a bandgap greater than that of the first nitride semiconductor layer. The first gate structure is disposed on the second nitride semiconductor layer. The first gate structure has a first side and a second side opposite to the first side. The second gate structure is disposed on the second nitride semiconductor layer. The second gate structure has a first side facing the second side of the first gate structure and a second side opposite to the first side. The first electrode is disposed between the first gate structure and the second gate structure. The thermistor is disposed between the first side of the first gate structure and the second side of the second gate structure.

According to some embodiments of the present disclosure, a method of manufacturing a semiconductor device structure includes: providing a substrate; forming a first nitride semiconductor layer on the substrate; forming a second nitride semiconductor layer on the first nitride semiconductor layer; forming a gate structure on the second nitride semiconductor layer;

forming a first electrode on the second nitride semiconductor layer; forming a second electrode on the second nitride semiconductor layer; forming a temperature sensitive component external to a region between the gate structure and the first electrode along a first direction in parallel to an interface of the first nitride semiconductor layer and the second nitride semiconductor layer; and forming a first metal layer electrically connected to the second electrode, wherein the temperature sensitive component is disposed between the second electrode and the first metal layer along a second direction substantial vertical to the interface of the first nitride semiconductor layer and the second nitride semiconductor layer.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 5A, FIG. 5B, FIG. 5C, FIG. 5D, FIG. 5E, FIG. 5F, and FIG. 5G illustrate various stages of a method for manufacturing a semiconductor device structure in accordance with some embodiments of the present disclosure.

Figure 1:
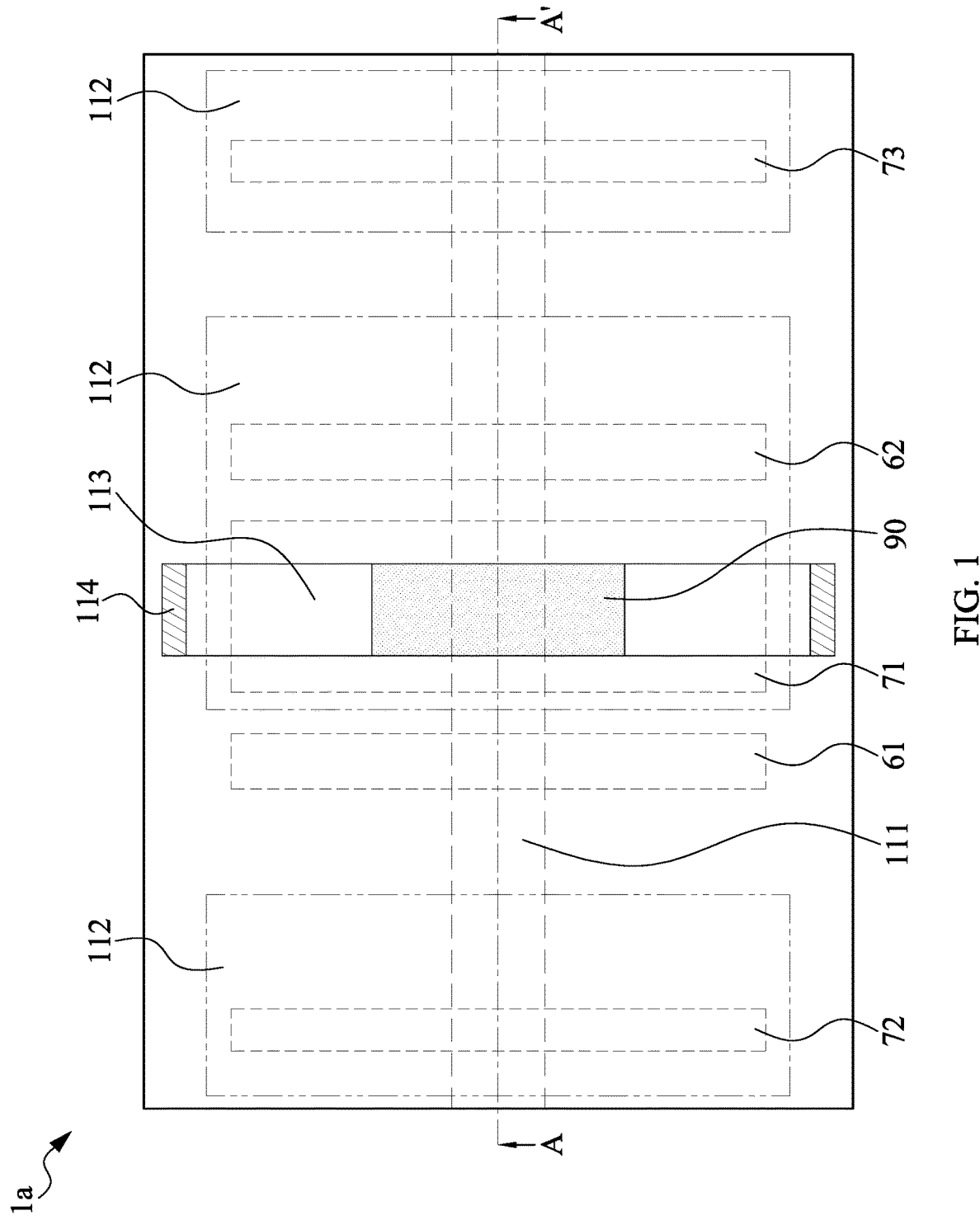
FIG. 1 is a top view of a semiconductor device structure in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

The following disclosure provides many different embodiments, or examples, for implementing different features of the provided subject matter. Specific examples of components and arrangements are described as follows. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail as follows. It should be appreciated, however, that the present disclosure provides many applicable concepts that can be embodied in a wide variety of specific contexts. The specific embodiments discussed are merely illustrative and do not limit the scope of the disclosure.

The present disclosure provides a semiconductor device structure including a temperature sensitive component. The temperature sensitive component may be integrated with the semiconductor device structure, assisting in precise temperature measurement of the semiconductor device structure. The semiconductor device structure of the present disclosure can be applied in, without limitation, HEMT devices, especially in low voltage HEMT devices, high voltage HEMT devices and radio frequency (RF) HEMT devices.

FIG. 1 is a top view of a semiconductor device structure 1a in accordance with some embodiments of the present disclosure. In order to clearly depict positional relation between a temperature sensitive element and other elements, some elements are omitted and some are illustrated with dotted lines for clarity. The semiconductor device structure 1a may include a gate structure 61, a gate structure 62, an electrode 71, an electrode 72, an electrode 73, a temperature sensitive component 90, a metal layer 111, a metal layer 112, a metal layer 113, and a pad 114. The electrode 71 may be disposed between the gate structure 61 and the gate structure 62. The gate structure 61 may be disposed between the electrode 71 and the electrode 72. The gate structure 62 may be disposed between the electrode 71 and the electrode 73. The metal layer 111 (or a metal 1 layer) may be across the gate structure 61, gate structure 62, electrode 71, electrode 72 and electrode 73. The metal layer (or a metal 2 layer) 112 may be disposed over the metal layer 111. The metal layer 112 may extend in a direction that is substantially perpendicular to the metal layer 111. The temperature sensitive component 90 may overlap the electrode 71. The temperature sensitive component 90 may be disposed external to a region between the gate structure 61 and the electrode 72. The temperature sensitive component 90 may be disposed external to a region between the gate structure 62 and the electrode 73. The temperature sensitive component 90 may be electrically connected to the pad 114 by the metal layer 113. The metal layer 113 may be disposed at an elevation the same as that of the metal layer 111. The metal layer 113 may be disposed at an elevation different from that of the metal layer 111.

Figure 2:
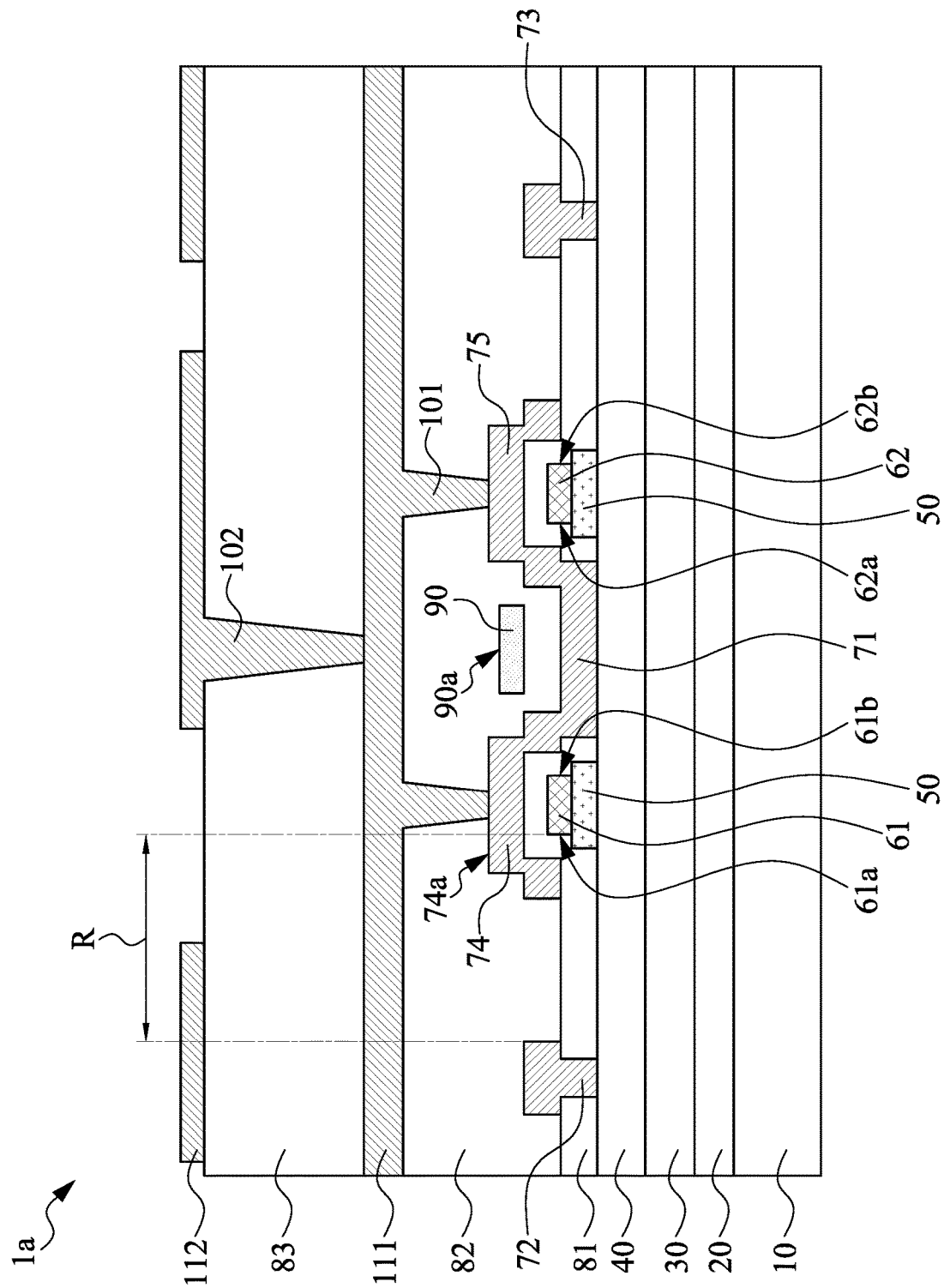
FIG. 2 is a cross-sectional view of a semiconductor device structure along line A-A' of FIG. 1 in accordance with some embodiments of the present disclosure.

FIG. 2 is a cross-sectional view of a semiconductor device structure 1a along line A-A' of FIG. 1 in accordance with some embodiments of the present disclosure. The semiconductor device structure 1a may include a substrate 10, a buffer layer 20, a nitride semiconductor layer 30, a nitride semiconductor layer 40, a nitride semiconductor layer 50, a gate structure 61, a gate structure 62, an electrode 71, an electrode 72, an electrode 73, a dielectric layer 81, a dielectric layer 82, a dielectric layer 83, a temperature sensitive component 90, a metal layer 111 and a metal layer 112.

The substrate 10 may include, without limitation, silicon (Si), doped Si, silicon carbide (SiC), germanium silicide (SiGe), gallium arsenide (GaAs), or other semiconductor materials. The substrate 10 may include, without limitation, sapphire, silicon on insulator (SOI), or other suitable materials.

The buffer layer 20 may be disposed on the substrate 10. The buffer layer 20 may be configured to reduce defect due to the dislocation between the substrate 10 and the nitride semiconductor layer 30. The buffer layer 20 may include, but is not limited to, nitride, such as AlN, AlGaN or the like.

The nitride semiconductor layer 30 (or a channel layer) may be disposed on the buffer layer 20. The nitride semiconductor layer 30 may include a group III-V layer. The nitride semiconductor layer 30 may include, but is not limited to, a group III nitride, for example, a compound $In_aAl_bGa_{1-a-b}N$, in which $a+b\leq1$. The group III nitride further includes, but is not limited to, for example, a compound $Al_aGa_{(1-a)}N$, in which $a\leq1$. The nitride semiconductor layer 30 may include a gallium nitride (GaN) layer. GaN has a bandgap of about 3.4 eV. The thickness of the nitride semiconductor layer 30 may range, but is not limited to, from about 0.5 μm to about 10 μm.

The nitride semiconductor layer 40 (or a barrier layer) may be disposed on the nitride semiconductor layer 30. The nitride semiconductor layer 40 may include a group III-V layer. The nitride semiconductor layer 40 may include, but is not limited to, a group III nitride, for example, a compound $In_aAl_bGa_{1-a-b}N$, in which $a+b\leq1$. The group III nitride may further include, but is not limited to, for example, a compound $Al_aGa_{(1-a)}N$, in which $a\leq1$. The nitride semiconductor layer 40 may have a greater bandgap than that of the nitride semiconductor layer 30. The nitride semiconductor layer 40 may include an aluminum gallium nitride (AlGaN) layer. AlGaN has a bandgap of about 4.0 eV. The thickness of the nitride semiconductor layer 40 may range, but is not limited to, from about 10 nm to about 100 nm.

A heterojunction is formed between the nitride semiconductor layer 40 and the nitride semiconductor layer 30, and the polarization of the heterojunction forms a two-dimensional electron gas (2DEG) region in the nitride semiconductor layer 30.

The nitride semiconductor layer 50 (or a depletion layer) may be disposed on the nitride semiconductor layer 40. The nitride semiconductor layer 50 may be in direct contact with the nitride semiconductor layer 40. The nitride semiconductor layer 50 may be doped with impurities. The nitride semiconductor layer 50 may include p-type dopants. It is contemplated that the nitride semiconductor layer 50 may include a p-doped GaN layer, p-doped AlGaN layer, p-doped AlN layer or other suitable III-V group layers. The p-type dopants may include magnesium (Mg), beryllium (Be), zinc (Zn) and cadmium (Cd).

The nitride semiconductor layer 50 may be configured to control the concentration of the 2DEG in the nitride semiconductor layer 30. The nitride semiconductor layer 50 can be used to deplete the 2DEG directly under the nitride semiconductor layer 50.

The gate structure 61 may be disposed on the nitride semiconductor layer 50. The gate structure 61 may be disposed between the electrode 71 and the electrode 72. The gate structure 61 may include a gate metal. The gate metal may include titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable materials. The gate structure 61 may have a surface 61a (or a side surface) facing the electrode 72. The gate structure 61 may have a surface 61b (or a side surface) opposite the surface 61a.

The gate structure 62 may be disposed on the nitride semiconductor layer 50. The material of the gate structure 62 may be the same as or similar to that of the gate structure 61. The gate structure 62 may have a surface 62a (or a side surface) facing the surface 61b. The gate structure 62 may have a surface 62b (or a side surface) opposite the surface 62a.

The electrode 71 (or a source electrode) may be disposed on the nitride semiconductor layer 40. The electrode 71 may be in contact with the nitride semiconductor layer 40. The electrode 71 may include, for example, without limitation, a conductive material. The conductive material may include metals, alloys, doped semiconductor materials (e.g., doped crystalline silicon), or other suitable conductive materials, such as Ti, Al, Ni, Cu, Au, Pt, Pd, W, TiN or other suitable materials. The electrode 71 may include a multilayer structure. For example, the electrode 71 may include a structure of two layers of different material. The electrode 71 may include a structure of three layers, two adjacent layers of which are made of different materials. The electrode 71 may be electrically connected to ground. The electrode 71 may be electrically connected to a virtual ground. The electrode 71 may be electrically connected to real ground.

The electrode 72 (or a drain electrode) may be disposed on the nitride semiconductor layer 40. The electrode 72 may be in contact with the nitride semiconductor layer 40. The electrode 72 may include, for example, without limitation, a conductive material. The conductive materials may include metals, alloys, doped semiconductor materials (e.g., doped crystalline silicon), or other suitable conductive materials, such as Ti, Al, Ni, Cu, Au, Pt, Pd, W, TiN, or other suitable materials. The electrode 72 may have a structure similar to or the same as electrode 71.

The electrode 73 (or a drain electrode) may be disposed on the nitride semiconductor layer 40. The electrode 71 may be disposed between the electrode 72 and the electrode 73. The electrode 73 may have a structure similar to or the same as electrode 71.

The dielectric layer 81 may be disposed on the nitride semiconductor layer 40. The dielectric layer 81 may be disposed on the gate structure 61. The gate structure 61 may be separated from the electrode 71 by the dielectric layer 81. The gate structure 61 may be separated from the electrode 72 by the dielectric layer 81. The dielectric layer 81 may be disposed on the gate structure 62. The gate structure 62 may be separated from the electrode 71 by the dielectric layer 81. The gate structure 62 may be separated from the electrode 73 by the dielectric layer 81. The dielectric layer 81 may include oxide, nitride, oxynitride or other suitable materials.

The extension 74 may be disposed on the dielectric layer 81. The extension 74 may cover the gate structure 61. The extension 74 may overlap the gate structure 61. The extension 74 may extend from the electrode 71. The extension 74 may extend into a region R between the gate structure 61 and the electrode 72. The extension 74 may be electrically connected to the electrode 71. The extension 74 may be configured to serve as, for example, a field plate, which may control electric field between electrodes, such as the gate structure 61 and electrode 72. The extension 74 may have a structure similar to or the same as electrode 71.

The extension 75 may be disposed on the dielectric layer 81. The extension 75 may cover the gate structure 62. The extension 75 may overlap the gate structure 62. The extension 75 may extend from the electrode 71. The extension 75 may extend into a region between the gate structure 61 and the electrode 73. The extension 75 may be electrically connected to the electrode 71. The extension 75 may be configured to serve as, for example, a field plate, which may control electric field between electrodes, such as the gate structure 62 and electrode 73. The extension 75 may have a structure similar to or the same as electrode 71.

The dielectric layer 82 may be disposed on the dielectric layer 81. The material of the dielectric layer 82 may be the same as or similar to that of the dielectric layer 81. The material of the dielectric layer 82 may be different form that of the dielectric layer 81.

The temperature sensitive component 90 may be disposed on the dielectric layer 82. The temperature sensitive component 90 may have a property, such as resistance, volume, or profile, that is responsive to temperature. For example, when temperature changes, the resistance of temperature sensitive component 90 may change, the volume of temperature sensitive component 90 may change, or the profile of temperature sensitive component 90 may change.

The temperature sensitive component 90 may be disposed on the electrode 71. The temperature sensitive component 90 may be disposed over the electrode 71. The temperature sensitive component 90 may be spaced apart from the electrode 71. The temperature sensitive component 90 may be spaced apart from the electrode 71 by the dielectric layer 82. The temperature sensitive component 90 may be disposed between the extension 74 and the extension 75. The temperature sensitive component 90 may be disposed between the gate structure 61 and the gate structure 62.

The temperature sensitive component 90 may be disposed external to a region R between the gate structure 61 and the electrode 72 along an axis parallel to an interface between the nitride semiconductor layer 30 and the nitride semiconductor layer 40. The region R may be defined as a region between the surface 61a of the gate structure 61 and the electrode 72. The temperature sensitive component 90 may be free from overlapping the region R. The temperature sensitive component 90 may be disposed external to a region between the gate structure 62 and the electrode 73. The temperature sensitive component 90 may be disposed between the surface 61a of the gate structure 61 and the surface 62b of the gate structure 62. The temperature sensitive component 90 may be disposed between the surface 61b of the gate structure 61 and the surface 62a of the gate structure 62. The surface 74a (or an upper surface) of the extension 74 may have an elevation exceeding that of the surface 90a (or an upper surface) of the temperature sensitive component 90. The surface 74a of the extension 74 may have an elevation the same as that of the surface 90a of the temperature sensitive component 90.

The temperature sensitive component 90 may be configured to sense temperature of, for example, the semiconductor device structure 1a. The temperature sensitive component 90 may include a temperature sensitive material. For example, the temperature sensitive component 90 may include a thermistor whose resistance varies when temperature changes. The change in resistance of the temperature sensitive component 90 may be proportional to the change in temperature. The temperature sensitive component 90 may have a linear relationship between change in resistance and change in temperature. For example, the temperature sensitive component 90 may include a positive thermal coefficient material, in which resistance increases with increased temperature. The positive thermal coefficient material may include, for example, TiN or other materials. The temperature sensitive component 90 may include a negative thermal coefficient material, in which resistance decreases with increase in temperature. The negative thermal coefficient material may include, for example, polysilicon or other materials The temperature sensitive component 90 may include titanium nitride (TiN). The temperature sensitive component 90 may include titanium (Ti). The temperature sensitive component 90 may include Aluminum (Al). The temperature sensitive component 90 may include a single layer structure. For example, the temperature sensitive component 90 may include a single layer of TiN. The temperature sensitive component 90 may include a single layer of Ti. The temperature sensitive component 90 may include a single layer of Al. The material of the temperature sensitive component 90 may be different from that of the extension 74. The material of the temperature sensitive component 90 may be different from that of the electrode 71.

The temperature sensitive component 90 may be electrically isolated from the gate structure 61. The temperature sensitive component 90 may be electrically isolated from the gate structure 62. The temperature sensitive component 90 may be electrically isolated from the electrode 71. The temperature sensitive component 90 may be electrically isolated from the electrode 72. The temperature sensitive component 90 may be electrically isolated from the electrode 73.

The metal layer 111 (or a metal 1 (M1) layer) may be disposed on the dielectric layer 82. The metal layer 111 may be electrically connected to the electrode 71 through a via 101. Although it is not illustrated in FIG. 2, it is contemplated that the electrode 72 may be electrically connected to M1 layer through a via present in another cross section. Similarly, the gate structure 61 may be electrically connected to M1 layer through a via present in another cross section. The temperature sensitive component 90 may be disposed between the metal layer 111 and the electrode 71 along an axis perpendicular to the interface between the nitride semiconductor layer 30 and the nitride semiconductor layer 40.

The dielectric layer 83 may be disposed on the metal layer 111.

The metal layer 112 (or a metal 2 (M2) layer) may be disposed on the dielectric layer 83. The metal layer 112 may be electrically connected to the metal layer 111 through a via 102.

In a conventional semiconductor device structure, a temperature sensitive component is an external component disposed outside the semiconductor device structure. However, the external temperature sensitive component cannot reflect a real temperature of the device because heat generated from the device may be transmitted to the external temperature sensitive component along a lengthy conductive path. In this embodiment, the temperature sensitive component 90 can be integrated within the semiconductor device structure 1a. Heat generated from the semiconductor device structure 1a can be transmitted to the temperature sensitive component 90 along a relatively short conductive path, thereby reflecting an accurate temperature of the semiconductor device structure 1a. As a result, the semiconductor device structure 1a can be turned off in a timely manner before the semiconductor device structure 1a overheats.

Since the highest temperature of a device usually occurs in the corner of a gate facing a drain side, the temperature sensitive component can reflect temperature more precisely when it is disposed in proximity to the gate structure. In this embodiment, the temperature sensitive component 90 is disposed between the metal layer 111 and the electrode 71 such that there is minimal distance between the gate structure 61 and the temperature sensitive component 90.

However, a temperature sensitive component may perturb electric field when disposed too closely to electrodes, especially to a region between a gate structure and a drain. In this embodiment, the temperature sensitive component 90 is disposed external to the region R, preventing adverse effects on electric parameters of the semiconductor device structure 1a.

Further, the temperature sensitive component 90 is electrically isolated from electrodes, such as the gate structure 61, electrode 71, and electrode 72, thereby ensuring that electric parameters remain intact under operation of the temperature sensitive component 90.

It is contemplated that a field plate, which is multilayered to control electric field, cannot serve as an effective temperature sensitive component because the structure may have a nonlinear relationship between change in resistance and that of temperature. In this embodiment, the temperature sensitive component 90 may include a single layer structure, ensuring a linear relationship between change in resistance and that in temperature.

Figure 3:
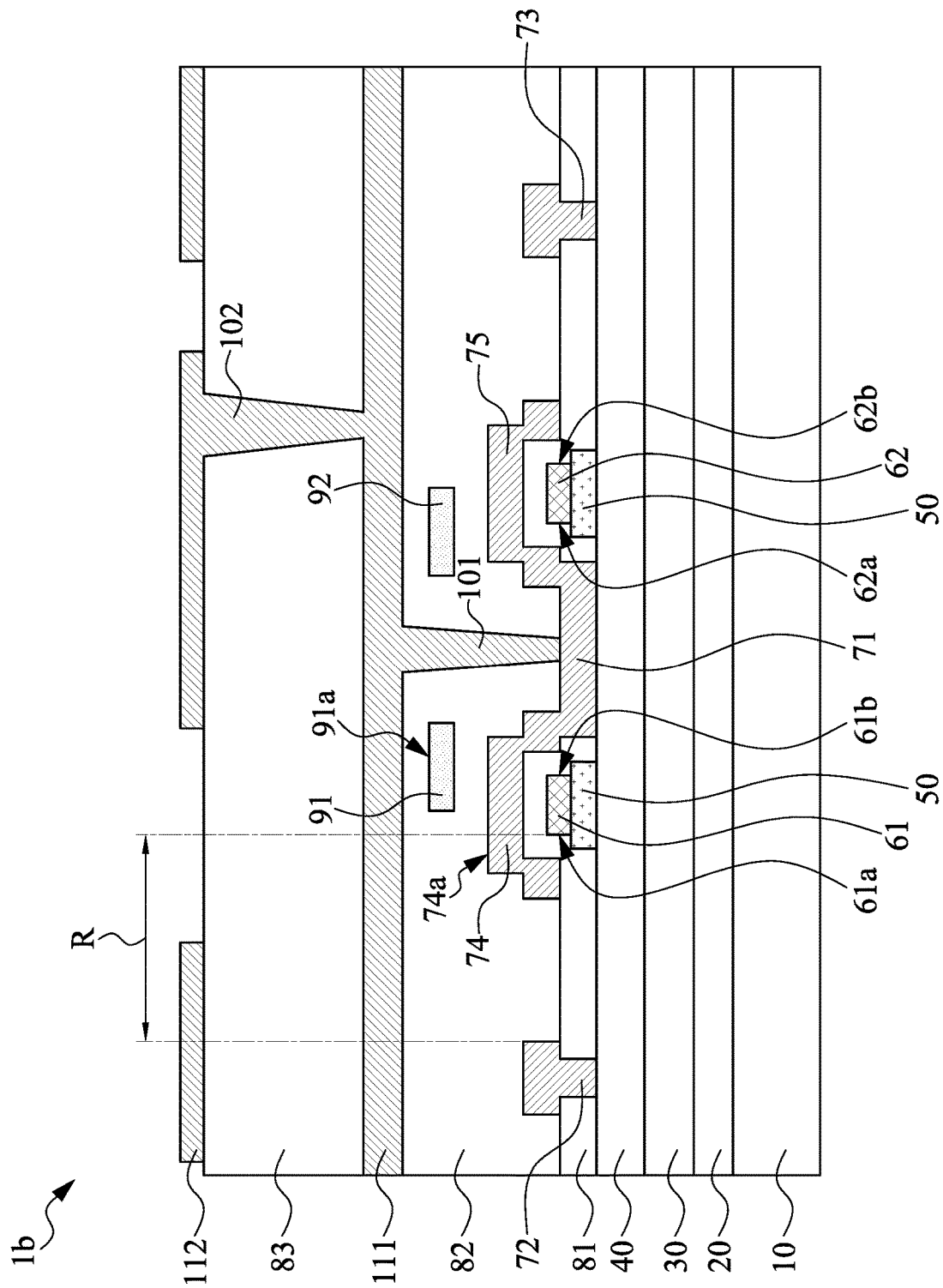
FIG. 3 is a cross-sectional view of a semiconductor device structure in accordance with some embodiments of the present disclosure.

FIG. 3 is a cross-sectional view of a semiconductor device structure 1b in accordance with some embodiments of the present disclosure. The semiconductor device structure 1b may have a structure similar to the semiconductor device structure 1a except that the temperature sensitive components may be disposed over the gate structure.

The temperature sensitive component 91 may be disposed over the gate structure 61. The temperature sensitive component 91 may be disposed directly over the gate structure 61. The temperature sensitive component 91 may cover the extension 74. The extension 74 may be disposed between the gate structure 61 and the temperature sensitive component 91 along an axis perpendicular to an interface between the nitride semiconductor layer 30 and the nitride semiconductor layer 40. The surface 91a of the temperature sensitive component 91 may have an elevation exceeding that of the surface 74a of the extension 74. The temperature sensitive component 92 may be disposed over the gate structure 62. The temperature sensitive component 92 may be disposed directly over the gate structure 62. The extension 75 may be disposed between the gate structure 62 and the temperature sensitive component 92.

Figure 4:
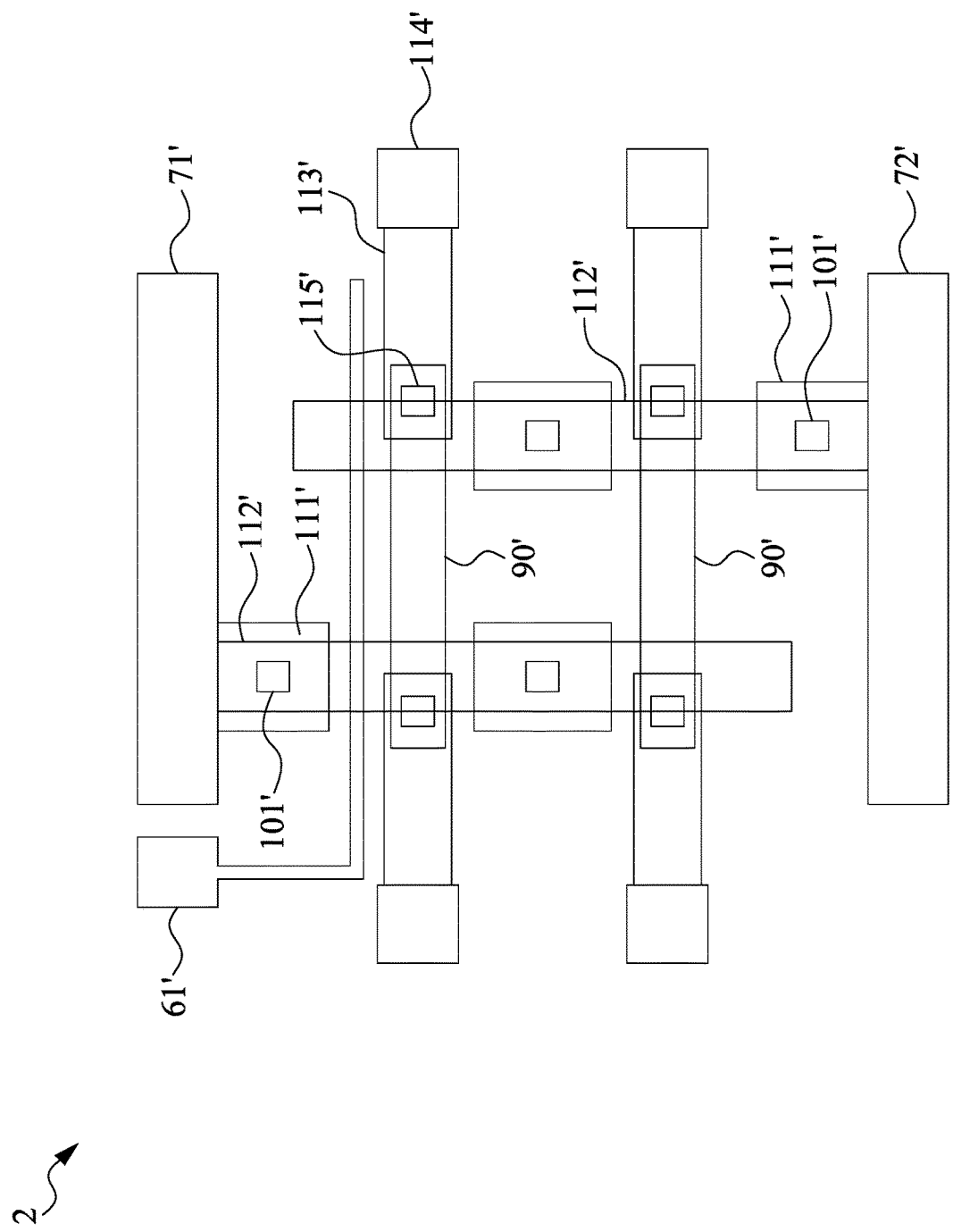
FIG. 4 is a top view of a layout of multiple semiconductor devices in accordance with some embodiments of the present disclosure.

FIG. 4 is a top view of a layout of a device 2 in accordance with some embodiments of the present disclosure.

The device 2 may include multiple semiconductor device structures, such as the semiconductor device structure 1a.

The pad 61' may be a pad electrically connected to multiple gate structures, such as the gate structure 61 and the gate structure 62. The pad 71' may be a pad electrically connected to multiple source electrodes, such as the electrode 71. The pad 72' may be a pad electrically connected to multiple drain electrodes, such as the electrodes 72 and 73. The temperature sensitive component 90', via 101', metal layer 111', metal layer 112', metal layer 113' and pad 114' may be similar to the temperature sensitive component 90, via 101, metal layer 111, metal layer 112, metal layer 113 and pad 114, respectively. The temperature sensitive component 90' may be electrically connected to the metal layer 113' through a via 115'. The temperature sensitive component 90' may be electrically connected to the pad 114'. The metal layer 113' may be electrically isolated from the metal layer 111'. The pad 114' may be electrically isolated from the pad 61'. The pad 114' may be electrically isolated from the pad 71'. The pad 114' may be electrically isolated from the pad 72'.

Multiple temperature sensitive components 90' may be disposed within the device 2. The temperature sensitive components 90' may be disposed between the pad 71' and the pad 72'. When more temperature sensitive components 90' are distributed within the device 2, temperature of the device 2 may be measured more accurately.

FIG. 5A, FIG. 5B, FIG. 5C, FIG. 5D, FIG. 5E, FIG. 5F, and FIG. 5G illustrate various stages of a method for manufacturing a semiconductor device structure in accordance with some embodiments of the present disclosure.

Figure 5A:
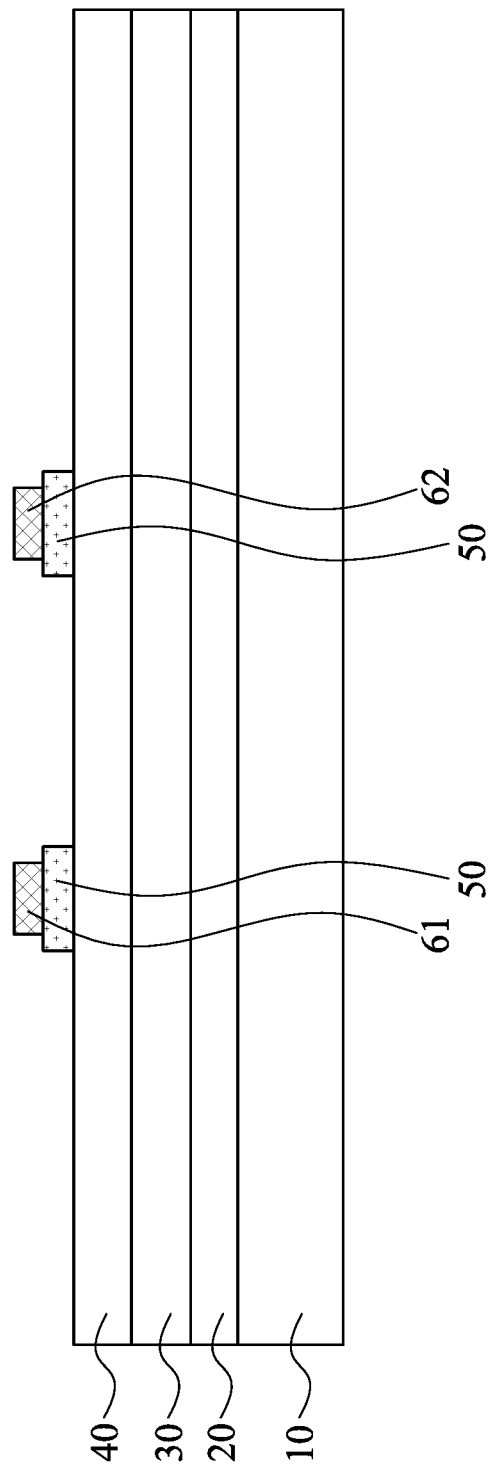

Referring to FIG. 5A, the substrate 10 is provided. The buffer layer 20, the nitride semiconductor layer 30, the nitride semiconductor layer 40, the nitride semiconductor layer 50, the gate structure 61 and the gate structure 62 may be formed on the substrate 10. The buffer layer 20, the nitride semiconductor layer 30 and the nitride semiconductor layer 40, for example, may be formed through metal organic chemical vapor deposition (MOCVD), epitaxial growth or other suitable deposition steps. The nitride semiconductor layer 50 may be formed through the epitaxy technique.

Figure 5B:
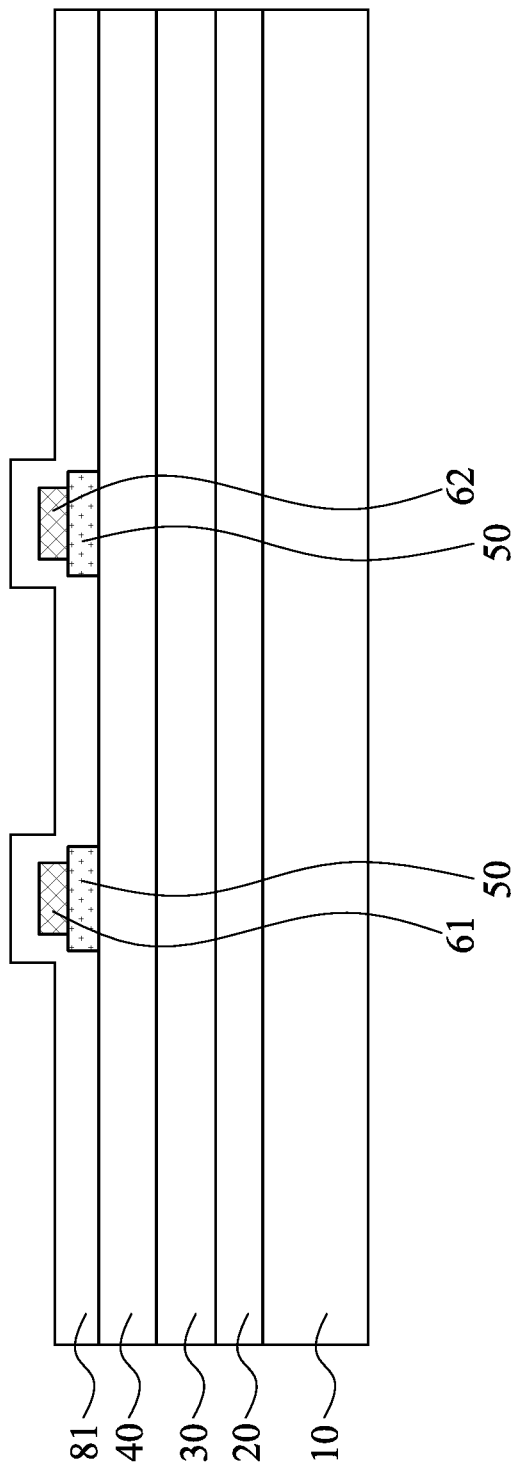

Referring to FIG. 5B, the dielectric layer 81 may be formed on the nitride semiconductor layer 40, the nitride semiconductor layer 50, the gate structure 61 and the gate structure 62. The dielectric layer 81 may be conformally formed on the nitride semiconductor layer 40, the nitride semiconductor layer 50, the gate structure 61 and the gate structure 62.

Figure 5C:
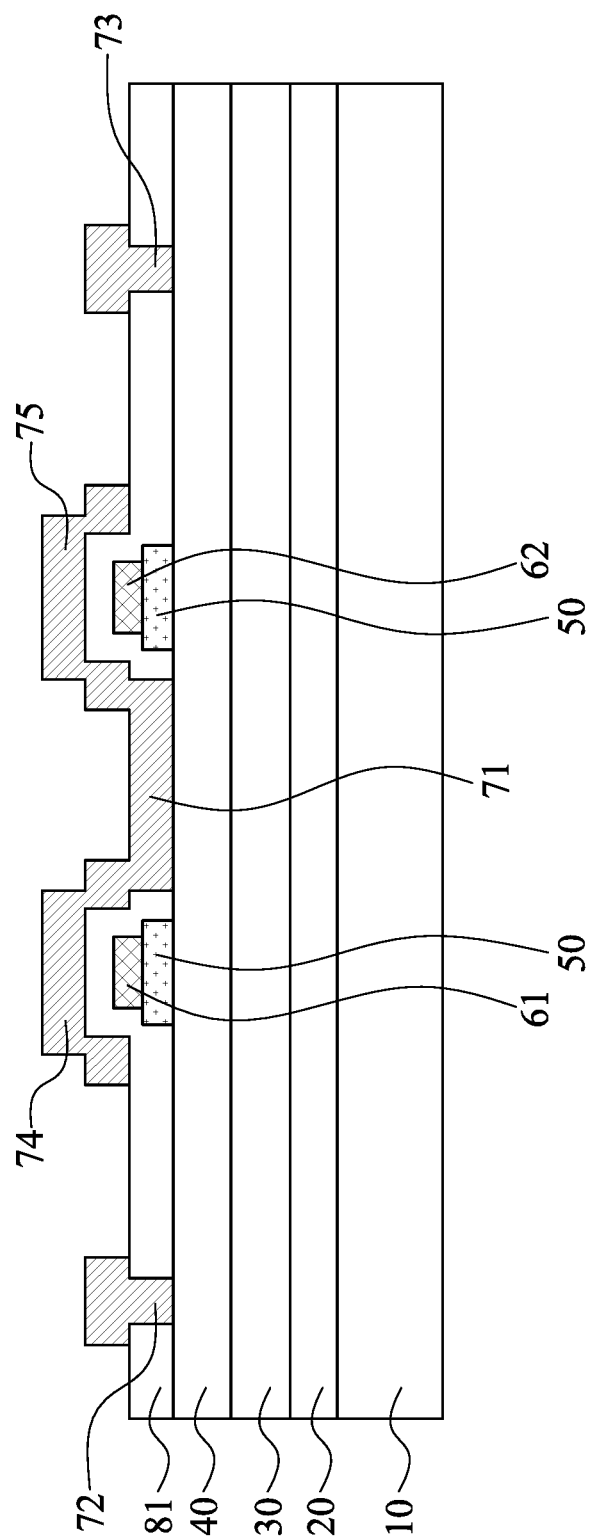

Referring to FIG. 5C, the electrode 71, the electrode 72 and the electrode 73 may be formed on the nitride semiconductor layer 40 and the dielectric layer 81. For example, the dielectric layer 81 may be patterned to expose a portion of the nitride semiconductor layer 40, and then a conductive material may be deposited to cover the nitride semiconductor layer 40 and the dielectric layer 81. Next, the conductive material is patterned to form the electrode 71, the electrode 72 and the electrode 73.

Figure 5D:
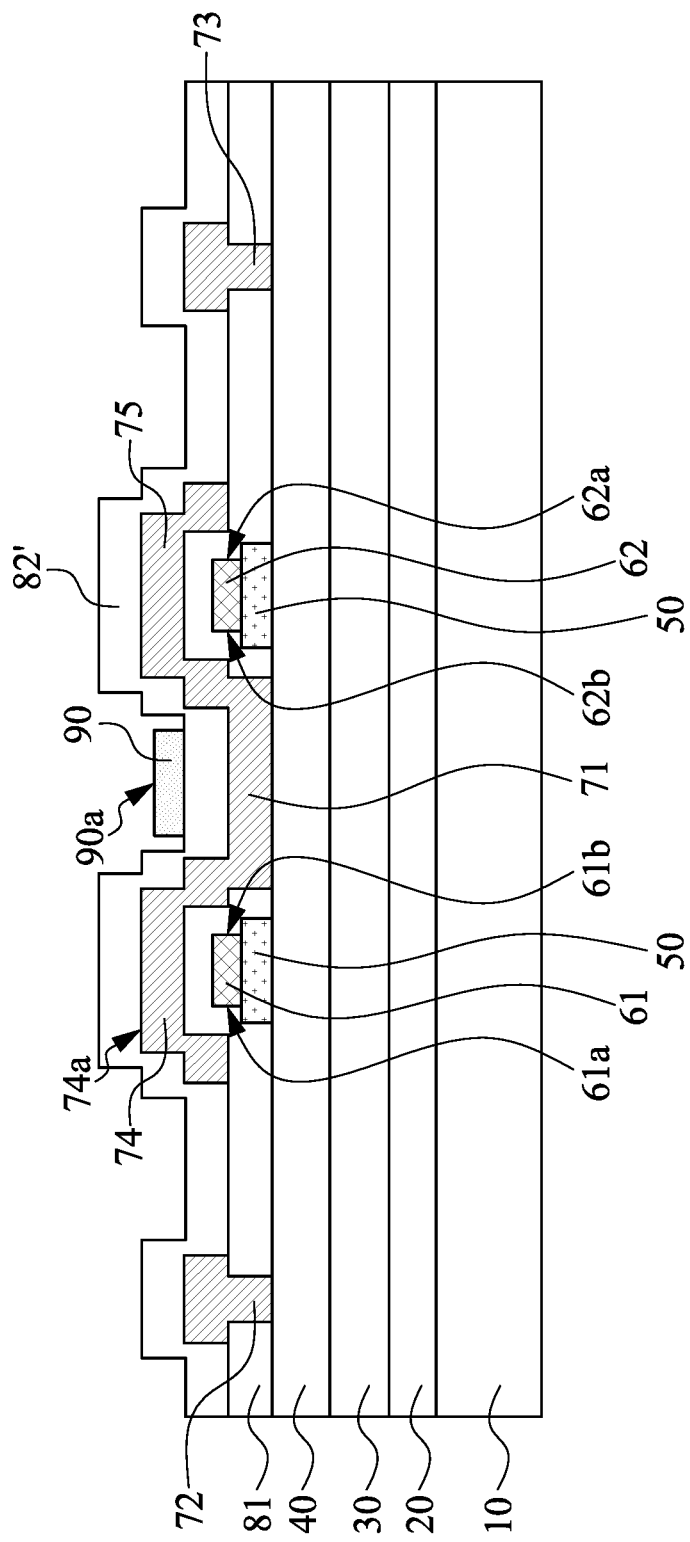

Referring to FIG. 5D, a dielectric layer 82' may be formed to cover the electrode 71, the electrode 72 and the electrode 73. The temperature sensitive component 90 may be formed on the dielectric layer 82'.

Referring to FIG. 5E, the dielectric layer 82 may be formed so that the temperature sensitive component 90 may be embedded in the dielectric layer 82.

Figure 5F:
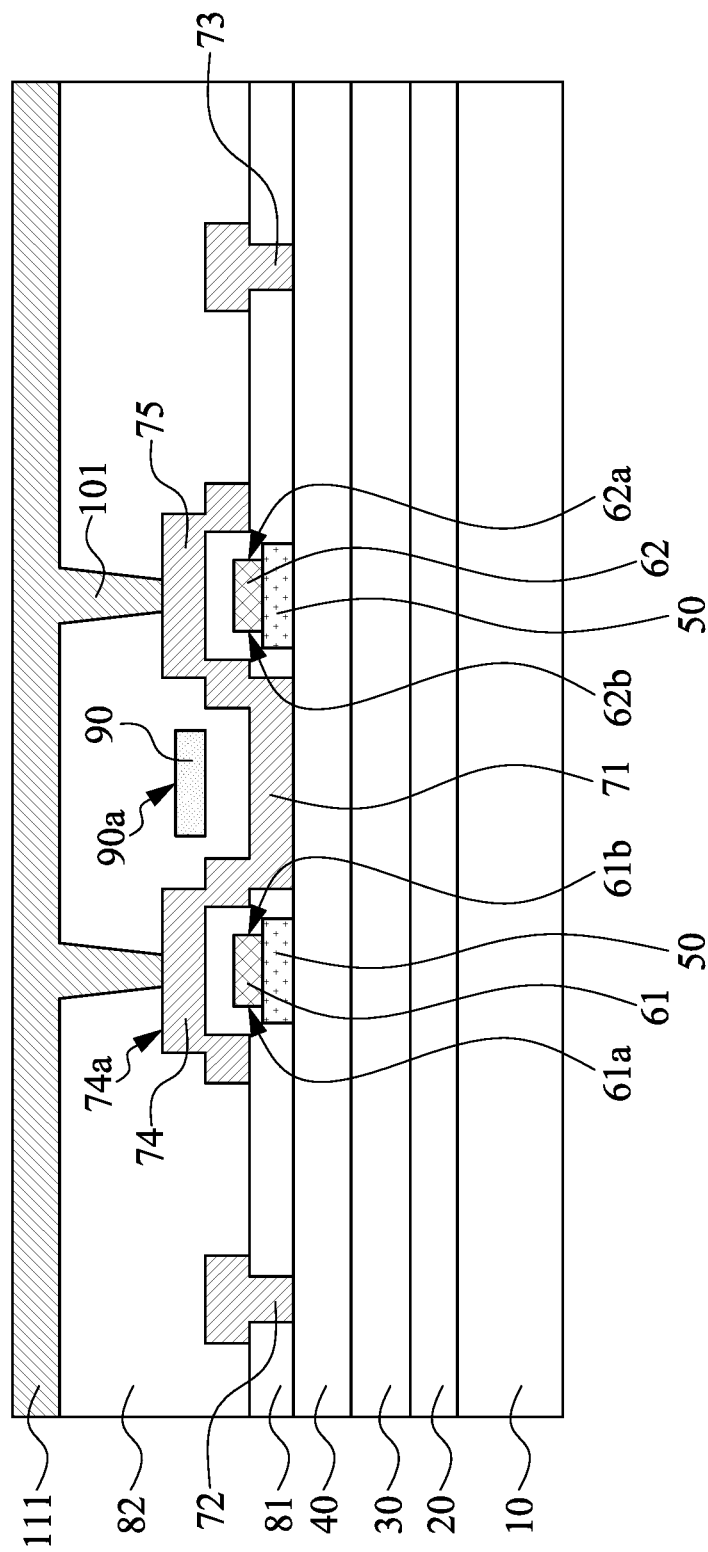

Referring to FIG. 5F, the via 101 and the metal layer 111 may be formed on the dielectric layer 82. For example, multiple openings defined by the dielectric layer 82 may be formed, and then a conductive material may be deposited filling the openings to form the via 101 and the metal layer 111.

Figure 5G:
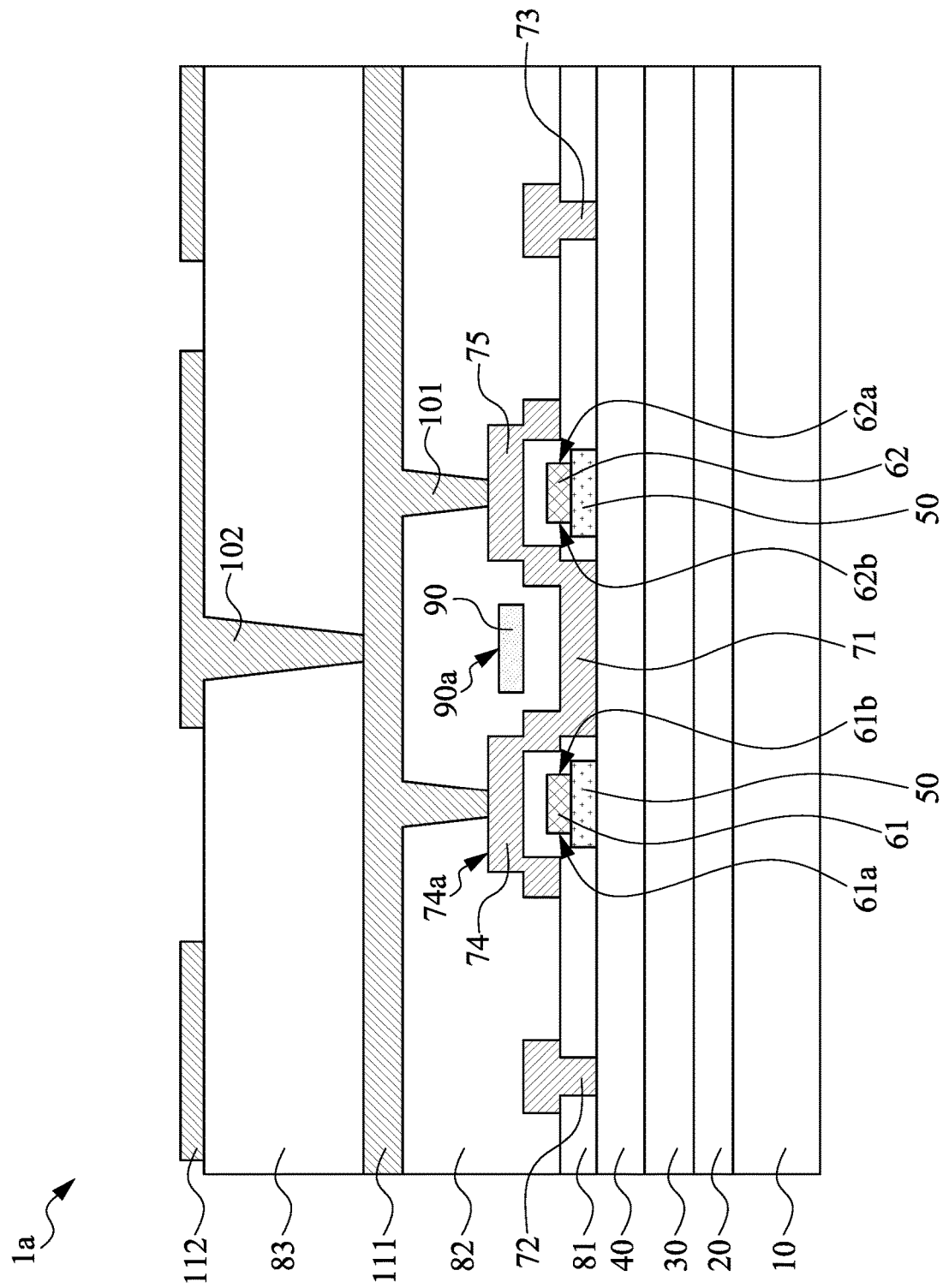

Referring to FIG. 5G, the dielectric layer 83, the via 102 and the metal layer 112 may be formed to create a semiconductor device structure the same as or similar to the semiconductor device structure 1a described and illustrated in FIG. 2.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 80 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event of circumstance occurs precisely as well as instances in which the event or circumstance occurs to a close approximation. As used herein with respect to a given value or range, the term "about" generally refers to within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device structure, comprising:
   a substrate;
   a first nitride semiconductor layer disposed on the substrate;
   a second nitride semiconductor layer disposed on the first nitride semiconductor layer and having a bandgap greater than that of the first nitride semiconductor layer;
   a first electrode disposed on the second nitride semiconductor layer;
   a second electrode disposed on the second nitride semiconductor layer;
   a gate structure disposed on the second nitride semiconductor layer and between the first electrode and the second electrode;
   a temperature sensitive component disposed external to a region between the gate structure and the first electrode along a first direction in parallel to an interface of the first nitride semiconductor layer and the second nitride semiconductor layer; and
   a first metal layer electrically connected to the second electrode, wherein the temperature sensitive component is disposed between the second electrode and the first metal layer along a second direction substantial vertical to the interface of the first nitride semiconductor layer and the second nitride semiconductor layer.

2. The semiconductor device structure of claim 1, wherein the temperature sensitive component comprises a temperature sensitive material.

3. The semiconductor device structure of claim 1, wherein the temperature sensitive component comprises a material having positive thermal coefficient.

4. The semiconductor device structure of claim 1, wherein the temperature sensitive component comprises a material having negative thermal coefficient.

5. The semiconductor device structure of claim 1, wherein the temperature sensitive component comprises titanium nitride.

6. The semiconductor device structure of claim 5, wherein the temperature sensitive component comprises a single layer structure.

7. The semiconductor device structure of claim 1, wherein the temperature sensitive component is electrically isolated from the first electrode.

8. The semiconductor device structure of claim 1, wherein the temperature sensitive component is electrically isolated from the gate structure.

9. The semiconductor device structure of claim 1, wherein the temperature sensitive component is electrically isolated from the second electrode.

10. The semiconductor device structure of claim 1, wherein an upper surface of the temperature sensitive component is higher than an upper surface of an extension extending from the second electrode.

11. The semiconductor device structure of claim 1, wherein an upper surface of the temperature sensitive component is coplanar with an upper surface of an extension extending from the second electrode.

12. The semiconductor device structure of claim 1, wherein an upper surface of the temperature sensitive component is lower than an upper surface of an extension extending from the second electrode.

13. The semiconductor device structure of claim 1, wherein the temperature sensitive component covers a portion of an extension extending from the second electrode.

14. A method of manufacturing a semiconductor device structure, comprising:
   providing a substrate;
   forming a first nitride semiconductor layer on the substrate;
   forming a second nitride semiconductor layer on the first nitride semiconductor layer, wherein the second nitride semiconductor layer has a bandgap greater than that of the first nitride semiconductor layer;
   forming a gate structure on the second nitride semiconductor layer;
   forming a first electrode on the second nitride semiconductor layer;
   forming a second electrode on the second nitride semiconductor layer;
   forming a temperature sensitive component external to a region between the gate structure and the first electrode along a first direction in parallel to an interface of the first nitride semiconductor layer and the second nitride semiconductor layer; and
   forming a first metal layer electrically connected to the second electrode, wherein the temperature sensitive component is disposed between the second electrode and the first metal layer along a second direction substantial vertical to the interface of the first nitride semiconductor layer and the second nitride semiconductor layer.

* * * * *